(12) United States Patent
Jen et al.

(10) Patent No.: US 9,218,941 B2
(45) Date of Patent: Dec. 22, 2015

(54) ION IMPLANTATION SYSTEM AND METHOD WITH VARIABLE ENERGY CONTROL (71) Applicant: Axcelis Technologies, Inc., Beverly, MA (US)

(72) Inventors: Causon Ko-Chuan Jen, San Jose, CA (US); Marvin Farley, Ipswich, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 14/584,252

(22) Filed: Dec. 29, 2014

(65) Prior Publication Data

US 2015/0200073 A1 Jul. 16, 2015

Related U.S. Application Data (60) Provisional application No. 61/927,811, filed on Jan. 15, 2014.

(51) Int. Cl.
*G21K 5/10* (2006.01)
*H01J 37/08* (2006.01)
*H01J 37/317* (2006.01)
*H01J 37/302* (2006.01)

(52) U.S. Cl.
CPC ........... *H01J 37/3171* (2013.01); *H01J 37/302* (2013.01); *H01J 2237/047* (2013.01); *H01J 2237/24514* (2013.01); *H01J 2237/30483* (2013.01)

(58) Field of Classification Search
USPC ....... 250/281, 282, 396 R, 398, 423 R, 492.1, 250/492.2, 492.21; 315/5.41, 505; 313/359.1
See application file for complete search history.

(56) References Cited

U.S. PATENT DOCUMENTS

| | | | |
|---|---|---|---|
| 4,922,106 A | 5/1990 | Berrian et al. |
| 4,929,840 A | 5/1990 | Dykstra et al. |
| 4,980,562 A | 12/1990 | Berrian et al. |
| 5,091,655 A | 2/1992 | Dykstra et al. |
| 5,177,366 A | 1/1993 | King et al. |

(Continued)

*Primary Examiner* — Bernard E Souw
(74) *Attorney, Agent, or Firm* — Eschweiler & Associates, LLC (57) ABSTRACT

An ion implantation system and method for implanting ions at varying energies across a workpiece is provided. The system comprises an ion source configured to ionize a dopant gas into a plurality of ions and to form an ion beam. A mass analyzer is positioned downstream of the ion source and configured to mass analyze the ion beam. A deceleration/acceleration stage is positioned downstream of the mass analyzer. An energy filter may form part of the deceleration/acceleration stage or may positioned downstream of the deceleration/acceleration stage. An end station is provided having a workpiece support associated therewith for positioning the workpiece before the ion beam is also provided. A scanning apparatus is configured to scan one or more of the ion beam and workpiece support with respect to one another. One or more power sources are operably coupled to one or more of the ion source, mass analyzer, deceleration/acceleration stage, and energy filter. A controller is configured to selectively vary one or more voltages respectively supplied to one or more of the deceleration/acceleration stage and the energy filter concurrent with the scanning of the ion beam and/or workpiece support, wherein the selective variation of the one or more voltages is based, at least in part, on a position of the ion beam with respect to the workpiece support.

24 Claims, 7 Drawing Sheets

(56) References Cited

U.S. PATENT DOCUMENTS

| | | |
|---|---|---|
| 5,393,984 A | 2/1995 | Glavish |
| 6,055,460 A | 4/2000 | Shopbell |
| 6,441,382 B1 | 8/2002 | Huang |
| 6,744,377 B1 | 6/2004 | Inoue |
| 6,750,462 B2 | 6/2004 | Iwasawa et al. |
| 6,777,696 B1 | 8/2004 | Rathmell et al. |
| 7,112,809 B2 | 9/2006 | Rathmell et al. |
| 7,375,354 B2 | 5/2008 | Iwasawa et al. |
| 7,507,978 B2 * | 3/2009 | Vanderberg et al. ...... 250/492.21 |
| 7,544,957 B2 | 6/2009 | Walther et al. |
| 7,550,751 B2 | 6/2009 | Benveniste et al. |
| 7,576,339 B2 | 8/2009 | Rouh et al. |
| 7,615,763 B2 | 11/2009 | Vanderberg et al. |
| 7,982,195 B2 | 7/2011 | Agarwal et al. |
| 8,017,922 B2 | 9/2011 | Matsumoto et al. |
| 8,124,946 B2 * | 2/2012 | Ryding et al. ........... 250/492.21 |
| 2008/0128639 A1 | 6/2008 | Rouh et al. |
| 2014/0261171 A1 * | 9/2014 | Hahto et al. ................. 118/712 |
| 2015/0102233 A1 * | 4/2015 | Kaim et al. .................. 250/424 |

* cited by examiner

ION IMPLANTATION SYSTEM AND METHOD WITH VARIABLE ENERGY CONTROL

REFERENCE TO RELATED APPLICATIONS

This application claims the benefit of U.S. Provisional Application No. 61/927,811 filed Jan. 15, 2014, entitled "ION IMPLANTATION SYSTEM AND METHOD WITH VARIABLE ENERGY CONTROL", the contents of which are herein incorporated by reference in their entirety.

FIELD

The present invention relates generally to ion implantation systems, and more specifically to a system and method for providing selectively controlled variable energy to an ion beam delivered to a workpiece during ion implantation thereof.

BACKGROUND

In the manufacture of semiconductor devices, ion implantation is used to dope semiconductors with impurities. Ion implantation systems are often utilized to dope a workpiece, such as a silicon or germanium wafer, with ions from an ion beam, in order to either produce n- or p-type material doping, or to form passivation layers during fabrication of an integrated circuit. When used for doping semiconductor wafers, the ion implantation system injects a selected ion species into the workpiece to produce desired electrical characteristics in the bulk material of the workpiece. Implanting ions generated from source materials such as antimony, arsenic, or phosphorus, for example, results in an "n-type" material characteristics, whereas a "p-type" material characteristics results from ions generated with source materials such as boron, gallium, or indium.

Typical ion implantation systems include an ion source for generating electrically charged ions from ionizable source materials. The generated ions are formed into a high speed ion beam utilizing a strong electric field to draw ions from the ion source and direct the ions along a predetermined beam path to an implantation end station that allows the workpiece to be transported in the path of the beam. The ion implanter may include beam forming and shaping structures extending between the ion source and the end station. The beam forming and shaping structures maintain the ion beam and bound an elongated interior cavity or passageway through which the ion beam passes en route to the end station. During operation, this passageway is typically evacuated in order to reduce the probability of ions being deflected from the predetermined beam path as a result of collisions with gas molecules.

It is common for the workpiece being implanted in the ion implantation system to be a semiconductor wafer having a size much larger than the size of ion beam. In most ion implantation applications, the goal of the implantation is to deliver a precisely-controlled amount of a dopant uniformly over the entire area of the surface of the workpiece or wafer. In order to achieve the uniformity of doping utilizing an ion beam having a size significantly smaller than the workpiece area, a widely used technology is a so-called hybrid scan system, where a small-sized ion beam is swept or scanned back and forth rapidly in one direction, and the workpiece is mechanically moved along the orthogonal direction of the scanned ion beam.

Alternatively, ribbon beam systems are known, which provide a lengthwise ion beam from the ion source, wherein the beam is allowed to further diverge as it travels toward the workpiece, thereby dispersing ions across a full width of the workpiece as the workpiece is mechanically moved along the orthogonal direction of the lengthwise ion beam. In yet another alternative, so-called "pencil beam" systems are known, wherein the ion beam is presented to the workpiece in the form of a spot while the workpiece is scanned in two dimensions, thereby "painting" the entire wafer with ions from the pencil beam.

A dosage of ions implanted into a workpiece by an ion beam has been conventionally controlled by variations in scan speed (e.g., a speed of the workpiece with respect to the ion beam, or vice-versa). For example, U.S. Pat. No. 4,922,106 to Berrian et al. discloses an ion implantation system wherein an ion beam is scanned and traverses over a workpiece in a controlled manner to attain a selected beam current and corresponding ion dose on the workpiece. A further feature of Berrian et al. is a method and apparatus for sensing the ion beam incident at the workpiece and controlling the exposure of the ion beam to the workpiece in order to attain a selected ion dosage at the workpiece, with the specific object of obtaining a highly uniform dosage over the entire surface of the workpiece.

In more refined integrated circuit manufacturing techniques, control of the implant process by implanting ions in a non-uniform manner can be advantageous for creating multiple regions on the workpiece that are implanted with different dose amounts. For example, U.S. Pat. No. 6,750,462 to Iwasawa et al. discloses an ion implanting method and apparatus wherein a plurality of ion implantation steps are executed by changing a driving speed of the workpiece. Further, a rotating step is provided for rotating the workpiece around its center by a prescribed angle between respective implanting steps while the ion beam is not applied to the workpiece in order to provide an implanted workpiece having a selectively controlled ion dosage across the surface thereof.

Typically, it is desirable to maintain a uniform energy distribution of ions implanted across the surface of a workpiece. However, U.S. Pat. No. 7,576,339 to Rouh et al., discloses an implantation system having an energy control feature for controlling the ion implantation energy of the ion beam based on a region of the wafer being implanted. As disclosed by Rouh et al., the distribution of ion implantation energy into a wafer is discretely (finitely) varied according to discrete or finite regions on the wafer, such that ions are implanted into a first region at a relatively high implantation energy, and ions are implanted into a second region at a relatively low implantation energy. In alternative embodiments of Rouh et al., a first discrete region of the wafer is implanted with a discrete, low implantation energy, a second discrete region is implanted with a discrete, high implantation energy, and a third region is again implanted with the low implantation energy. Again, the ion implantation energy is discretely varied based on discrete regions of the wafer.

SUMMARY

The following presents a simplified summary of the disclosure in order to provide a basic understanding of some aspects of the disclosure. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present disclosure is directed generally toward a system, apparatus, and method for selective continuous variation of an energy of ions implanted into a workpiece concurrent with the workpiece and an ion beam translating with respect to one another.

An ion implantation system is provided, including an ion source configured to ionize a dopant gas into a plurality of ions and to form an ion beam, and mass analyzer positioned downstream of the ion source and configured to mass analyze the ion beam. An electrode stage is positioned downstream of the mass analyzer for accelerating or decelerating the ion beam in response the bias voltages applied thereto. Further, an energy filter is provided for deflecting the ion beam wherein an output deflection angle can be maintained by selectively varying bias voltages applied to the energy filter in accordance the energy of the ion beam. An end station is positioned downstream of the energy filter, wherein the end station has a workpiece support associated therewith.

In a preferred embodiment, the present disclosure is further provided with a scanning apparatus configured to scan one or more of the ion beam and/or workpiece support with respect to one another. One or more power sources are operably coupled to one or more of the ion source, mass analyzer, electrode stage, and energy filter. A controller is further provided and configured to selectively vary one or more voltages respectively supplied to one or more of the electrode stage and the energy filter concurrent with the scanning of the spot ion beam and/or workpiece support, wherein the selective variation of the one or more voltages is based, at least in part, on a position of the ion beam with respect to the workpiece support.

In another embodiment of the present disclosure, a method for providing selective continuously variable energy ion implantation of a workpiece is provided. The method comprises the acts of directing an ion beam toward a workpiece, scanning one or more of the ion beam and workpiece with respect to one another, and selectively varying an energy of the ion beam concurrent with the scanning of one or more of the spot ion beam and workpiece. Accordingly, a resultant depth of implantation of ions into the workpiece is controlled and selectively varied in a continuous manner along a surface of the workpiece.

DETAILED DESCRIPTION

The present disclosure is directed generally toward a system, apparatus, and method for varying an energy of an ion beam in an ion implantation system. In one particular embodiment, the system, apparatus, and method for varying the energy of the ion beam is disclosed in conjunction with a scanned pencil beam system architecture of the type developed, manufactured and sold by Axcelis Technologies, Inc. of Beverly, Mass. However, it is also contemplated that the present disclosure can be implemented in commonly known ribbon beam or pencil beam ion implantation system architectures, as will be further described.

The present disclosure is applicable to, and is contemplated for implementation in, various ion implanters. For example, the present disclosure is applicable to three types of ion implanters: those that employ an ion beam that is swept in two dimensions across a workpiece, wherein a ribbon-shaped ion beam is defined having a lengthwise dimension greater than a width of the workpiece being irradiated with the ion beam; those that employ an ion beam that has a relatively static cross-sectional dimension and in which the workpiece is moved relative to the ion beam in two dimensions; and those that employ a hybrid system in which the ion beam is oscillated or scanned along a first direction relative to the workpiece and the workpiece is moved along a second direction that is transverse to the first direction.

The disclosed selective variable control of energy distribution in the ion implantation process has not been heretofore disclosed or contemplated, particularly a selective variable control of the implantation energy in a continuous manner across the surface of a target workpiece. Thus, the present disclosure provides a system, apparatus, and method for varying an energy distribution of ions implanted by an ion beam across the workpiece in a continuous manner.

The present disclosure provides a solution to a particular problem existing in advanced integrated circuit manufacturing. Recently, the integrated circuit manufacturing industry has adopted adaptive patterning processes, which, in many cases, rely on ancillary processes for removing materials deposited on a semiconductor workpiece. For example, a silicon wafer can be provided with an oxidation layer (or a polysilicon or nitride layer), which may be exposed to an implantation step, such as via hydrogen (e.g., typically used for exfoliating surfaces) or via reactive ions such as fluorine or chlorine (e.g., typically used for changing the chemical makeup of the oxidation layer). One preferred process for removing materials deposited on a semiconductor workpiece is so-called Chemical Mechanical Planarization or Polishing (CMP), which is a process for smoothing surfaces using the combination of chemical and mechanical forces. CMP can be thought of as a hybrid of chemical etching and free abrasive polishing and is a preferred method for removing material from a substrate in a planar and uniform fashion because it provides, among other things, the ability to stop material removal with precision and repeatability, such as at the important interface between copper and oxide insulating layers formed on a semiconductor wafer.

Despite various advantages of this process, the CMP process suffers in that it does not always remove some material layers with uniformity across the surface of the wafer. More specifically, it has been found that the coating layer being removed (e.g., usually an oxidized layer) can have a curved contour that is thicker in the middle of the wafer and thinner on the edges, resulting in a convex surface layer.

The present disclosure presently appreciates that by subjecting the layer to an ion implantation step prior to a CMP step, the resultant CMP-processed layer can have a more uniform thickness. In particular, ion implantation of the layer to be removed can change the CMP material removal rate. More particularly, the material removal rate can be tailored by the depth to which the ions are implanted, whereby the depth to which the ions are implanted is directly proportional to the energy of the ion being implanted.

A similar approach can be also applied to an etch process for control of smoothing a workpiece surface when a non-uniformed layer is formed across workpieces. Ion implantation with different energies delivered to different part(s) of workpiece according to surface layer thickness can modify the material etch rate at different depths. Therefore, a final depth of etch removal layer at different wafer locations can be controlled commensurate to the original non-uniformity, and thus yield a more uniform layer after etch.

Figure 1:
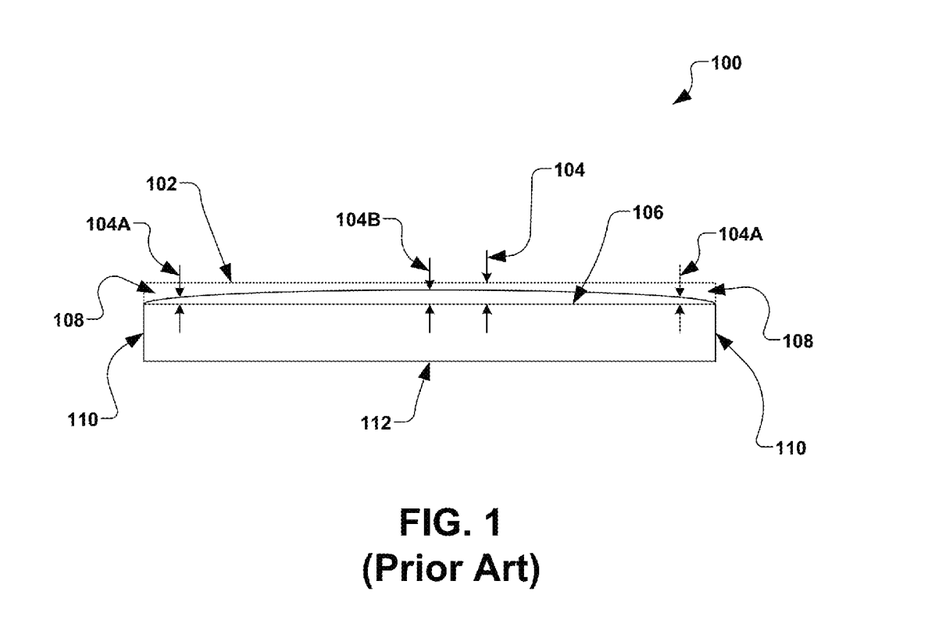
FIG. 1 is a partial cross-sectional view of a workpiece having an oxidizing layer thereon showing the effects of a conventional chemical-mechanical planarization or polish (CMP) process thereon.
Figure 2:
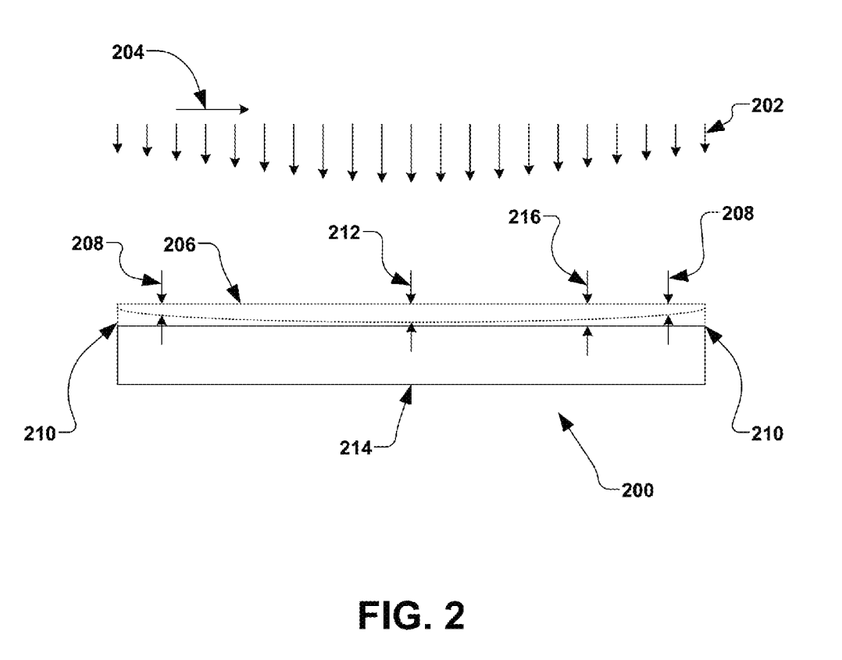
FIG. 2 illustrates a cross-sectional view of an exemplary workpiece undergoing ion implantation having a variation in ion energy concurrent with scanning to provide a continuously variable depth ion implant in accordance with one aspect of the present disclosure.
Figure 3:
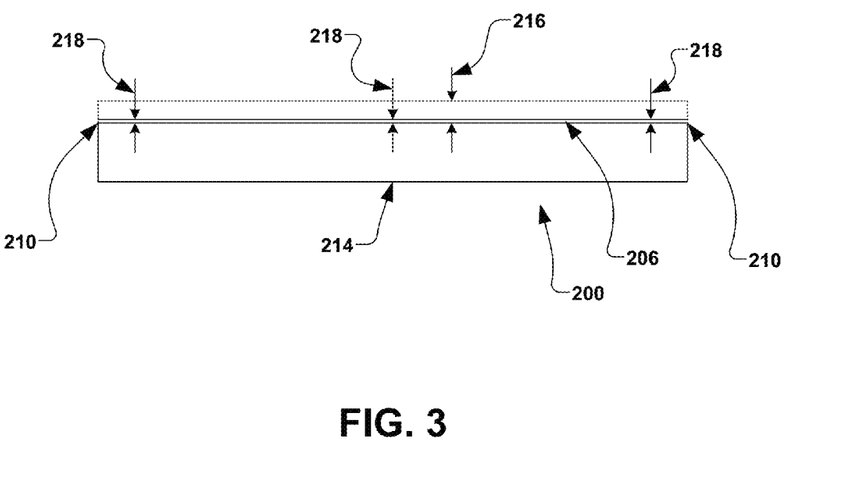
FIG. 3 illustrates a cross-sectional view of an exemplary workpiece having undergone a variable depth/energy ion implantation in accordance with the present disclosure and a CMP process in accordance with the foregoing description, illustrating one advantageous application for the present disclosure.

Thus, the present disclosure advantageously solves problems in the field of materials modification, thereby enabling advanced integrated circuit manufacturing techniques. With respect to the specific solution contemplated by the inventors, FIGS. 1-3 are provided as illustrative examples. FIG. 1, for example, depicts a workpiece 100, such as a conventional silicon wafer of the type used as the workpiece substrate at the initial step of the semiconductor manufacturing process. In this illustrative example, an oxidation layer 102 having a predetermined thickness 104 has been formed on the surface 106 of the workpiece 100. This oxidation layer 102 may subsequently be processed via CMP to achieve specified characteristics.

A typical CMP process uses an abrasive and corrosive chemical slurry (e.g., a colloid) in conjunction with a polishing pad. The polishing pad and workpiece 100 are pressed together by a dynamic polishing head that is rotated with different axes of rotation (i.e., not concentric). The objective of the CMP process is to remove material and to level out any irregular topography, thus making the wafer flat or planar, which is sometimes necessary in order to prepare the wafer for the subsequent formation of additional circuit elements. For example, CMP processing might be performed in order to bring the entire surface within the depth of field of a photolithography system, or to selectively remove material based on position.

While effective at removing material, the CMP process has been found to create center-to-edge thickness non-uniformity in a residual layer that remains on the workpiece 100. As illustrated in FIG. 1, this problem manifests itself in an oxidation layer 102 that is generally convex. For example, the oxidation layer 102 after the CMP process is thin in a circumferential region 108 proximate to a circumference 110 of the workpiece 100 (e.g., illustrated as thickness 104A), and thicker in a center region 112 proximate to a center of the workpiece (e.g., illustrated as thickness 104B). In order to address this problem, among others, the present disclosure contemplates a system and method for implanting ions at variable depths within the oxidation layer in order to change the CMP material removal rate.

Ion implantation depth is directly related to the energy of the ions implanted. By controlling the ion implantation depth in a manner corresponding to a desired CMP removal rate modification, the present disclosure advantageously tailors the material removal across the surface of the wafer to provide the desired uniform thickness and topography thereof. Thus, as illustrated in the exemplary workpiece 200 of FIGS. 2 and 3, one exemplary aspect of the present invention is contemplated, wherein ions are implanted (e.g., a scanned ion beam is illustrated as arrows 202 traveling in a scan direction 204 relative to the workpiece in FIG. 2) into an oxidation layer 206 at a shallow depth 208 along an edge or circumference 210 of the workpiece, while ions are implanted at a greater depth 212 toward a center 214 of the workpiece. As a result, upon subsequent chemical mechanical polishing of the oxidation layer 206, a thickness 216 of the oxidation layer can be made uniform across the workpiece 200 from the edge or circumference 210 to the center 214, as illustrated in FIG. 3 as a polished thickness 218. Such variable depth ion implantation is enabled by a system and method of the present disclosure for providing a continuous, selective variation of the ion implantation energy in an ion implant.

It will be understood that the foregoing application is but one of various processes and applications that are enabled by the continuous and variable depth ion implantation system and method of the present disclosure. The disclosure and claim scope is not limited to the solution for this problem, nor is it limited to a process for providing variable depth implants in a convex shape, a concave shape or any other shape or other contour of the workpiece. The variable, continuous, non-uniform ion energy implantation process of the present disclosure can be implemented in any manner as desired to provide a continuously variable implant depth contour, in addition to a non-continuous variable implant depth contour. For example, it is contemplated that the present disclosure can be utilized in any desired application wherein selectively variable ion implantation depths are desired via selective variation of ion implant energy. There can be a number of reasons to implant at different depths/energies across the surface of a workpiece, including but not limited to: variation of threshold voltages across the workpiece; systematic profile changes in energy profile of the implant across the scan width of the workpiece; and the ability to implant multiple dies of different electrical characteristics on a single wafer.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 4:
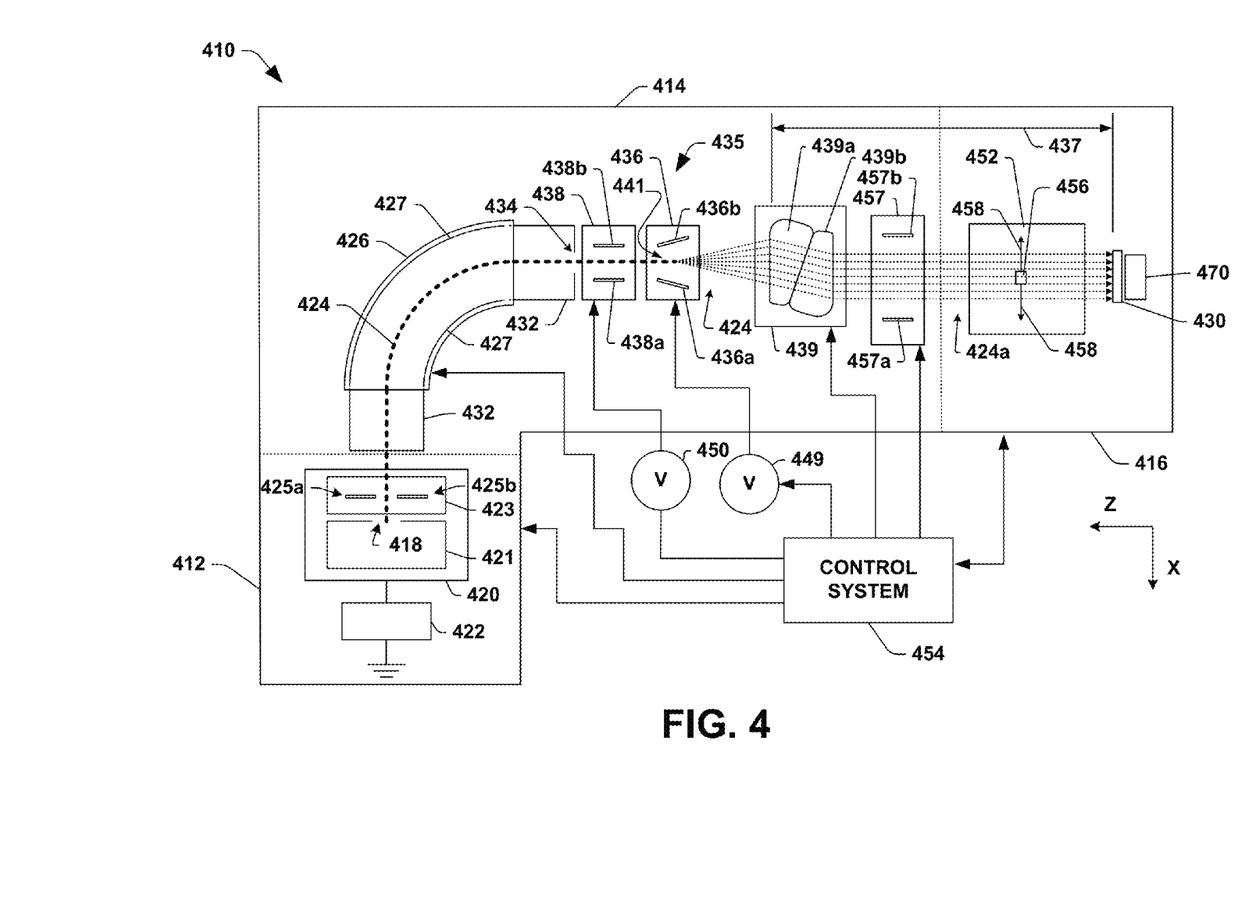
FIG. 4 is a block diagram of an exemplary ion implantation system in accordance with several aspects of the present disclosure.

FIG. 4 illustrates an exemplary ion implantation system 410 wherein ion beam energy can be selectively varied and/or controlled as described herein. The system 410 has a terminal 412, a beamline assembly 414, and an end station 416. The terminal 412 includes an ion source 420 powered by a high voltage power supply 422 that produces and directs an ion beam 424 to the beamline assembly 414. In this regard, the ion source 420 generates charged ions that are extracted from the source via extraction assembly 423 and formed into the ion beam 424 that is subsequently directed along a beam path in the beamline assembly 414 to the end station 416.

To generate the ions, a dopant material (not shown) to be ionized is provided within a generation chamber 421 of the ion source 420. The dopant material, for example, can be fed into the chamber 421 from a gas source (not shown). In one example, in addition to power supply 422, it will be appreciated that any number of suitable mechanisms (not shown) can be used to excite free electrons within the ion generation chamber 421, such as RF or microwave excitation sources, electron beam injection sources, electromagnetic sources and/or a cathode which creates an arc discharge within the chamber. The excited electrons collide with the dopant gas molecules, thereby generating ions. Generally, positive ions are generated, although the disclosure herein is also applicable to systems wherein negative ions are generated.

The ions are controllably extracted through a slit 418 in the chamber 421 by an ion extraction assembly 423, wherein the ion extraction assembly comprises a plurality of extraction and/or suppression electrodes 425. The ion extraction assembly 423, for example, can include a separate extraction power supply (not shown) to bias the extraction and/or suppression electrodes 425 for accelerating the ions from the generation chamber 421. It can be appreciated that since the ion beam 424 comprises like-charged particles, the ion beam may have a tendency to expand radially outwardly, or beam "blow up", as the like-charged particles repel one another within the ion beam. It can also be appreciated that this phenomenon of beam blow-up can be exacerbated in low energy, high current (e.g., high perveance) beams, where many like-charged particles are moving in the same direction relatively slowly, and wherein there is an abundance of repulsive forces among the particles, but little particle momentum to keep the particles moving in the direction of the beam path.

Accordingly, the extraction assembly 423 is generally configured such that the ion beam 424 is extracted at a high energy so that the ion beam does not blow up (e.g., so that the particles have sufficient momentum to overcome repulsive forces that can lead to beam blow up). Moreover, it is generally advantageous to transfer the beam 424 at a relatively high energy throughout the system, wherein this energy can be reduced as desired just prior to implantation of the ions into the workpiece 430 to promote beam containment. It can also be advantageous to generate and transport molecular or cluster ions which can be transported at a relatively high energy but are implanted with a lower equivalent energy, since the energy of the molecule or cluster is divided amongst the dopant atoms of the molecule.

The beamline assembly 414 includes a beamguide 432, a mass analyzer 426, a scanning system 435, a parallelizer 439, and one or more acceleration or deceleration and/or filtering subsystems 457. The mass analyzer 426 is configured to have approximately a ninety degree angle and comprises one or more magnets (not shown) that serve to establish a (dipole) magnetic field therein. As the ion beam 424 enters the mass analyzer 426, it is correspondingly bent by the magnetic field such that desired ions are transported down the beam path, while ions of an inappropriate charge-to-mass ratio are rejected. More particularly, ions having too great or too small a charge-to-mass ratio are deflected either insufficiently or exceedingly so as to be steered into side walls 427 of the mass analyzer 426 so that the mass analyzer allows those ions in the beam 424 that have the desired charge-to-mass ratio to pass there-through and exit through a resolving aperture 434.

A scanning system 435 is further illustrated, wherein the scanning system, for example, comprises a scanning element 436 and a focusing and/or steering element 438. The scanning system 435 can comprise various scanning systems, such as demonstrated in U.S. Pat. No. 4,980,562 to Berrian et al., U.S. Pat. No. 5,091,655 to Dykstra et al., U.S. Pat. No. 5,393,984 to Glavish, U.S. Pat. No. 7,550,751 to Benveniste et al., and U.S. Pat. No. 7,615,763 to Vanderberg et al., the entirety of which are hereby incorporated herein by reference.

In the exemplary scanning system 435, respective power supplies 449, 450 are operatively coupled to a scanning element 436 and a focusing and steering element 438, and more particularly to respective electrodes 436a, 436b and 438a, 438b located therein. The focusing and steering element 438 receives the mass analyzed ion beam 424 having a relatively narrow profile (e.g., a "pencil" beam in the illustrated system 410), wherein a voltage applied by the power supply 450 to the plates 438a and 438b operates to focus and steer the ion beam to an optimal point, preferably a scan vertex 441, of the scanning element 436. A voltage waveform applied by the power supply 449 (e.g., the power supply 450 can also serve as the power supply 449) to the scanner plates 436a and 436b then scans the beam 424 back and forth to spread the beam 424 out into an elongated "ribbon" beam (e.g., a scanned beam 424), having a width that may be at least as wide as or wider than the workpieces of interest. It will be appreciated that the scan vertex 441 can be defined as the point in the optical path from which each beamlet or scanned part of the ribbon beam appears to originate after having been scanned by the scanning element 436.

It will be understood that an ion implantation system of the type described herein may employ different types of scanning systems. For example, electrostatic systems or magnetic systems could be employed in the present invention. A typical embodiment of an electrostatic scanning system includes a power supply coupled to scanner plates or electrodes 436a and 436b, where the scanner 436 provides a scanned beam. The scanner 436 receives the mass analyzed ion beam having a relatively narrow profile (e.g., a "pencil" beam in the illustrated system), and a voltage waveform applied by the power supply 449 to the scanner plates 436a and 436b operates to scan the beam back and forth in the X direction (the scan direction) to spread the beam out into an elongated "ribbon" beam (e.g., a scanned beam), having an effective X-direction width that may be at least as wide as or wider than the workpieces of interest. Similarly, in a magnetic scanning system, a high current supply is connected to the coils of an electromagnet. The magnetic field is adjusted to scan the beam. For purposes of this disclosure, all different types of scanning systems are contemplated, and the electrostatic system is used for illustration. The scanned beam 424 is then passed through the parallelizer 438 that directs the beam toward the end station 416 generally parallel to the Z direction (e.g., generally perpendicular to the workpiece surface).

Figure 5:
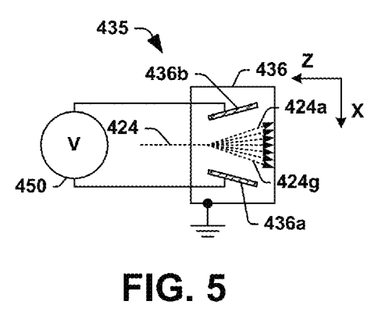
FIG. 5 is a schematic diagram of an exemplary scanner that could be incorporated into an exemplary ion implantation system in accordance with several aspects of the present disclosure.
Figure 6:
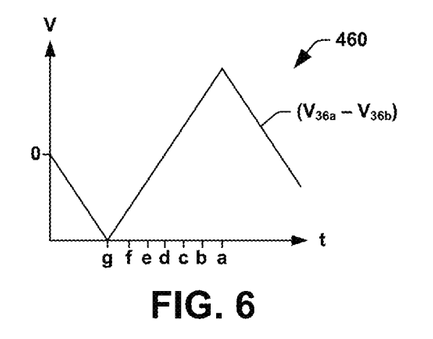
FIG. 6 is a depiction of a triangular or "saw-tooth" voltage waveform of the type typically applied to the scanner of FIG. 5.

Referring to FIGS. 5-6, the electrostatic version of the beam scanner 436 is further illustrated in FIG. 5, having a pair of scan plates or electrodes 436a and 436b on either lateral side of the beam path, and a voltage source 450 that provides alternating voltages to the electrodes 436a and 436b, as illustrated in a "sawtooth-type" waveform diagram 460 in FIG. 6. A time-varying voltage between the scan electrodes 436a and 436b creates a time-varying electric field across the beam path therebetween, by which the beam is bent or deflected (e.g., scanned) along a scan direction (e.g., the X direction in FIG. 5). When the scanner electric field is in the direction from the electrode 436a to the electrode 436b (e.g., the potential of electrode 436a is more positive than the potential of electrode 436b, such as at times "e," "f," and "g" in FIG. 6), the positively charged ions of the beam 424 are subjected to a lateral force in the negative X direction (e.g., toward the electrode 436b). When the electrodes 436a and 436b are at the same potential (e.g., zero electric field in the scanner 436, such as at time "d" in FIG. 6), the beam 424 passes through the scanner 436 unmodified. When the field is in the direction from the electrode 436b to the electrode 436a (e.g., times "a," "b," and "c" in FIG. 6), the positively charged ions of the beam 424 are subjected to a lateral force in the positive X direction (e.g., toward the electrode 436a). For illustrative purposes, FIG. 5 shows the scanned beam 424 deflection as it passes through the scanner 436 at several discrete points in time during scanning with the extreme beamlets 424a and 424g labeled to correspond to times "a" and "g" of FIG. 6.

Low energy implanters are typically designed to provide ion beams of a few thousand electron volts (keV) up to around 80-100 keV, whereas high energy implanters can employ RF linear acceleration (linac) apparatus (not shown) between the mass analyzer 426 of FIG. 4 and the end station 416 to accelerate the mass analyzed beam 424 to higher energies, typically several hundred keV, wherein DC acceleration is also possible. High energy ion implantation is commonly employed for deeper implants in the workpiece 430. Conversely, high current, low energy (high perveance) ion beams 424 are typically employed for high dose, shallow depth ion implantation, in which case the high perveance of the ion beam commonly causes difficulties in maintaining uniformity of the ion beam 424.

Referring once again to FIG. 4, the scanned beam 424 is subsequently passed through the parallelizer 439. Various parallelizer systems 439 are demonstrated by U.S. Pat. No. 5,091,655 to Dykstra et al., U.S. Pat. No. 5,177,366 to Dykstra et al., U.S. Pat. No. 6,744,377 to Inoue, U.S. Pat. No. 7,112,809 to Rathmell et al., and U.S. Pat. No. 7,507,978 to Vanderberg et al., the entirety of which are hereby incorporated herein by reference. As the name implies, the parallelizer 439 causes the incoming scanned pencil beam having divergent rays or beamlets to be deflected into parallel rays or beamlets 424a so that implantation parameters (e.g., implant angles) are uniform across the workpiece 430. In the presently illustrated embodiment, the parallelizer 439 comprises two dipole magnets 439a, 439b, wherein the dipoles are substantially trapezoidal and are oriented to mirror one another to cause the beam 424 to bend into a substantially "s-shape". In a preferred embodiment, the dipoles have equal angles and opposite bend directions.

The primary purpose of the dipoles is to convert a plurality of divergent rays or beamlets originating from the scan vertex 441 into a plurality of substantially parallel rays or beamlets having the form of a relatively thin, elongated ribbon shaped beam. The use of two symmetric dipoles, as illustrated herein, results in symmetrical properties across the ribbon beam in terms of beamlet path length and first and higher order focusing properties. Furthermore, similar to the operation of the mass analyzer 426, the s-shaped bend serves to decontaminate the ion beam 424. In particular, the trajectories of neutral particles and/or other contaminants (e.g., environmental particles) that enter the ion beam 424 downstream of the mass analyzer 426 are not generally affected by (or are affected very little by) the dipoles, such that these particles continue traveling along the original beam path, whereby a relatively large quantity of these neutral particles that do not get bent or get bent very little thus do not impact the workpiece 430 (e.g., the workpiece is positioned to receive the bent ion beam 424). It can be appreciated that it is important to remove such contaminants from the ion beam 424 as they may possess an incorrect charge, etc. Generally, such contaminants would not be affected (or are affected to a much lesser degree) by deceleration and/or other stages in the system 410. As such, they can have a significant (albeit unintended and generally undesirable) impact upon the workpiece 430 in terms of dose and angle uniformity. This can, in turn, produce unanticipated and undesirable resultant device performance.

Figure 7:
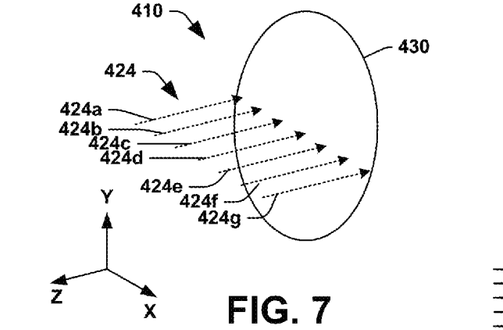
FIG. 7 is a perspective view illustrating a single scanned ion beam and several discrete points thereof striking a workpiece at several discrete points in time.
Figure 8:
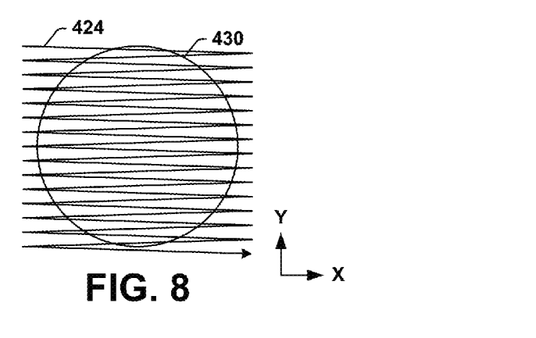
FIG. 8 is an end elevation view illustrating a typical scan pattern for scanning an ion beam across a surface of a workpiece for ion implantation thereof.

FIG. 7 illustrates the scanned and parallelized beam 424 impacting the workpiece 430 at the corresponding times indicated in FIG. 6. The scanned and parallelized ion beam 424a in FIG. 7 corresponds to the applied electrode voltages at the time "a" in FIG. 6, and subsequently, the beam 424b-424g is illustrated in FIG. 7 for scan voltages at corresponding times "b"-"g" of FIG. 6 for a single generally horizontal scan across the workpiece 430 in the X direction. FIG. 8 illustrates a straightforward scanning of the beam 424 across the workpiece 430, wherein mechanical actuation (not shown) translates the workpiece 430 in the positive Y-direction (e.g., slow scan direction) during X-direction (e.g., fast scan direction) scanning by the scanner 436, whereby the beam 424 is imparted on the entire exposed surface of the workpiece 430.

Referring once again to FIG. 4, downstream of the parallelization component 439, one or more deceleration stages 457 are provided. Examples of deceleration and/or acceleration systems are demonstrated by U.S. Pat. No. 5,091,655 to Dykstra et al. U.S. Pat. No. 6,441,382 to Huang and U.S. Pat. No. 8,124,946 to Farley et al., the entirety of which are hereby incorporated herein by reference. As previously indicated, up to this point in the system 410, the beam 424 is generally transported at a relatively high energy level to mitigate the propensity for beam blow-up, which can be particularly high where beam density is elevated such as at a resolving aperture 434, for example. Similar to the ion extraction assembly 423, scanning element 436 and focusing and steering element 438, the deceleration stage 457 comprises one or more electrodes 457a, 457b operable to decelerate the beam 424.

It will be appreciated that while two electrodes 425a and 425b, 436a and 436b, 438a and 438b and 457a and 457b are respectively illustrated in the exemplary ion extraction assembly 423, scanning element 436, focusing and steering element 438 and deceleration stage 457, these elements 423, 436, 438 and 457 may comprise any suitable number of electrodes arranged and biased to accelerate and/or decelerate ions, as well as to focus, bend, deflect, converge, diverge, scan, parallelize and/or decontaminate the ion beam 424 such as provided in U.S. Pat. No. 6,777,696 to Rathmell et al., the entirety of which is hereby incorporated herein by reference. Additionally, the focusing and steering element 438 may comprise electrostatic deflection plates (e.g., one or more pairs thereof), as well as an Einzel lens, quadrupoles and/or other focusing elements to focus the ion beam. Although not necessary, it can be advantageous to apply voltages to the deflecting plates within element 438 so that they average to zero, the effect of which is to avoid having to introduce an additional Einzel lens to mitigate the distortion of the focusing aspect of element 438. It will be appreciated that "steering" the ion beam 424 is a function of the dimensions of plates 438a, 438b and the steering voltages applied thereto, among other things, as the beam direction is proportional to the steering voltages and the length of the plates, and inversely proportional to the beam energy.

Figure 9:
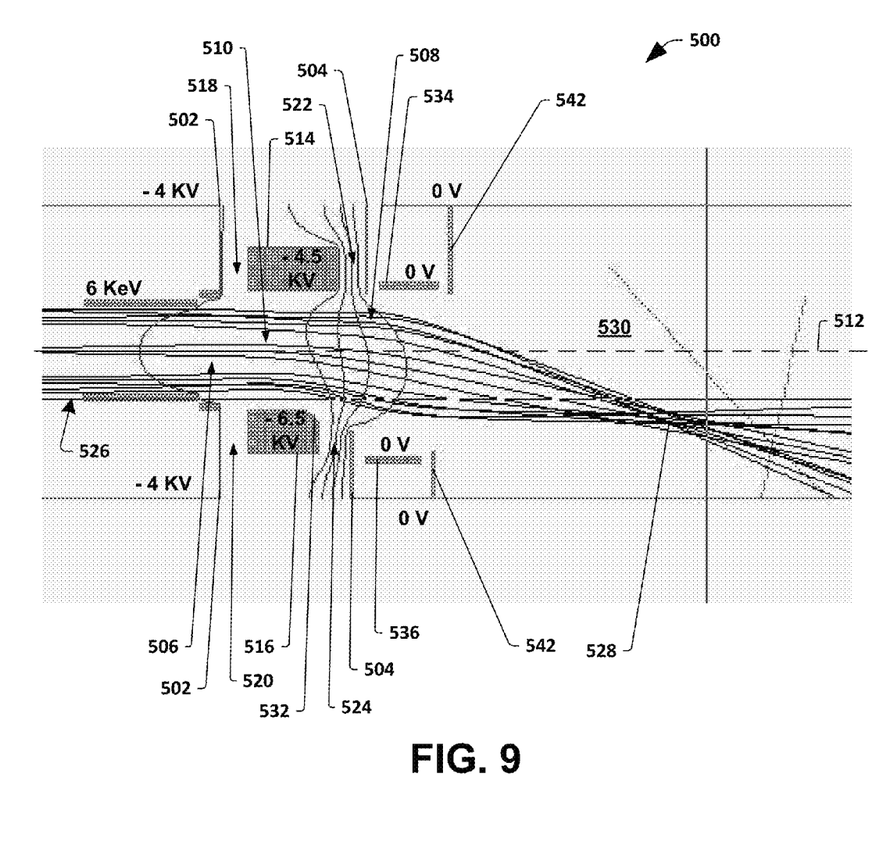
FIG. 9 is an illustration depicting deceleration and bending effects created by electrode column of the type used in deceleration stage/angular energy filter device of an exemplary ion implantation apparatus according to another aspect of the present disclosure.

Turning now to FIG. 9, an exemplary deceleration/acceleration stage 457 in accordance with one or more aspects of the present disclosure is illustrated in greater detail as an electrode column 500, which includes first and second electrodes 502 and 504 and a pair of intermediate electrode plates 514 and 516. The first and second electrodes 502 and 504 are substantially parallel to one another and define first and second apertures 506 and 508, respectively. A gap 510 is defined between the apertures 506, 508 and the electrodes 502, 504 are arranged such that an axis 512 substantially normal to the first and second electrodes 502, 504 runs through the gap 510 and through the first and second apertures 506, 508. The intermediate electrode plates comprise an upper mid-gap electrode 514 and a lower mid-gap electrode 516. A first upper sub-gap area 518 is defined between the first electrode 502 and the upper mid-gap electrode 514. A first lower sub-gap area 520 is defined between the first electrode 502 and the lower mid-gap electrode 516. Similarly, a second upper sub-gap area 522 is defined between the second electrode 504 and the upper mid-gap electrode 514, and a second lower sub-gap area 524 is defined between the second electrode 504 and the lower mid-gap electrode 516. An ion beam 526 passes through the gap 510 and is deflected from the axis 512, such as by about 12 degrees, for example, and is focused at a point 528 downstream from the gap 510.

In the illustrated example, particular biases are depicted to facilitate a discussion of the operation of the accelerator 500. It will be appreciated, however, that, for purposes of the present disclosure, any suitable biases may be applied among the electrodes to achieve desired results (e.g., a degree of acceleration, deceleration, and/or deflection). Indeed, in the context of the present disclosure wherein variable ion beam energy is the desired result, it will be understood that variation of the bias voltages applied to these electrodes will be essential. The bias values in FIG. 9 are, however, effective to demonstrate deceleration of the ion beam 526.

The ion beam 526, and more particularly the positive ions contained therein, enter the gap 510 through the first aperture 506 with an initial energy level (e.g., 6 KeV in the example illustrated). In order to accelerate or decelerate the ions in the beam, the first and second electrodes 502 and 504 are biased differently so that a difference in potential exists therebetween and the ions experience a corresponding increase or decrease in energy as they pass through the gap 510 between the first and second electrodes 502, 504. For instance, in the example presented in FIG. 9, the positive ions of the ion beam experience an energy drop of 4 KeV as they pass from the first electrode 502 which has a negative 4 KV bias to the second electrode 504 which has zero potential (e.g., is coupled to ground). Thus, the original ion beam energy of positive 6 KeV is reduced to 2 KeV as the ions pass through the gap 510 and experience a 4 KeV energy drop. The ion beam 526 will therefore have a particular resulting energy level (e.g., 2 KeV in the example illustrated) once it exits the gap 510 and enters a neutral zone 530 downstream from the gap 510.

It will be appreciated that this is true regardless of the path the ions may have taken to get through the gap 510. For instance, in the example illustrated, ions entering the lower sub-gap 520 between the first electrode 502 and the lower mid-gap electrode 516 will be accelerated at a rate greater than the rate at which ions entering the upper sub-gap 518 between the first electrode 502 and the upper mid-gap electrode 514 will be accelerated. This is because there is a greater difference in potential between the first electrode 502 and the lower mid-gap electrode 516 than there is between the first electrode 502 and the upper mid-gap electrode 514 (e.g., negative 2.5 KV for the lower sub-gap 520 (negative 4 KV minus negative 6.5 KV) and negative 0.5 KV for the upper sub-gap 518 (negative 4 KV minus negative 4.5 KV)).

This difference in acceleration is, however, offset by a corresponding difference in potential between the upper 514 and lower 516 mid-gap electrodes and the second electrode 504. For instance, in the example illustrated, the second electrode 504 is biased to zero (e.g., coupled to ground). Thus, the ions coming from the first lower sub-gap 520 are decelerated to a greater degree than the ions coming from the first upper sub-gap 518. This offsets the differences in acceleration of the ions as they enter the gap such that as the ions exit the gap they all possess substantially the same energy (e.g., 2 KeV). The ions coming from the first lower sub-gap 520 will be decelerated to a greater degree because they will have to traverse the negative 6.5 KV while crossing the second lower sub-gap 524 (e.g., the negative 6.5 KV bias of the lower mid-gap electrode 516 minus the zero V bias of the second electrode 504). By contrast, the ions coming from the first upper sub-gap 518 will be decelerated to a lesser degree because they will merely have to traverse the negative 4.5 KV while crossing the second upper sub-gap 522 (e.g., the negative 4.5 KV bias of the upper mid-gap electrode 614 minus the zero V bias of the second electrode 504). Accordingly, regardless of the different paths they take and the energy levels they fall through, the ions emerge from the effects of the gap at substantially the same energy level (e.g., 2 KeV).

It will be appreciated that the upper and lower mid-gap electrodes 514, 516 serve the dual purpose of pulling the beam into the gap 510 to accelerate or decelerate the ion beam, and to provide beam deflection for beam filtering purposes. For example, the mid-gap plates 514, 516 are generally biased differently from one another so that an electrostatic field is developed therebetween to bend or deflect the beam either up or down, or with varying magnitude, depending upon the magnitude of the biasing of the electrodes and relative to the energy of the ion beam. In the example featured, for instance, the upper and lower mid-gap electrodes 514, 516 are biased to negative 4.5 KV and negative 6.5 KV, respectively. Presuming the beam comprises positively charged ions, this difference in potential causes the positively charged ions passing through the gap 510 to be forced downward toward the more negatively charged lower mid-gap electrode 516, ultimately causing the beam 526 to bend or deflect downward (e.g., by about 12 degrees). It will be understood that in order to maintain this exemplary 12 degree deflection in view of a varying energy beam, the bias applied to the mid-gap electrodes 514, 516 must also be varied in a corresponding manner.

For example, acceleration of an ion beam can be induced by biasing electrodes 534, 536 to negative 4 KV while biasing electrodes 502, 506 to positive 40 KV, although any biasing value(s) are contemplated by the present disclosure. This biasing arrangement creates a negative potential barrier which extends out into the neutral zone 530. It will be appreciated that with these bias voltages applied the operation of the device is substantially similar to that described with reference to FIG. 5, with the exception that the beam 526 is accelerated rather than decelerated. These exemplary values serve to increase the energy level of the beam from, for example 80 KeV to 120 KeV, accelerating the beam by factor of 1.5, wherein positive ions in the beam 526 will be accelerated as the ions traverse the second upper sub-gap area 522 and the second lower sub-gap area 524.

It will be appreciated that the arrangement, configuration and/or shaping of the upper 514 and lower 516 mid-gap electrodes can be tailored to facilitate control over the lensing effect of the beam. By way of example, in the illustration depicted in FIG. 9, the lower mid-gap electrode 516 has a slightly reduced width relative to that of the upper mid-gap electrode 514 and also possesses a slightly beveled corner 532. These adjustments essentially counter the increased lensing effects that the ions near the lower mid-gap electrode 516 experience as they undergo stronger acceleration and/or deceleration due to differences in applied biases. It will be appreciated, however, that for purposes of the present disclosure these electrodes 514, 516 can have any suitable configurations, including identical shapes. It will be further appreciated that the beam can be bent in acceleration, deceleration and/or drift (e.g., zero accel/decel) modes because the upper and lower mid-gap electrodes 514, 516, which are predominately responsible for beam bending, operate substantially independently of the first and second electrodes 502, 504, which are predominantly responsible for the acceleration/deceleration of the beam 510.

The overall net effect of all of the differences in potential is focusing, deceleration (or acceleration) and deflecting of ions in the beam 526. Deflection of the ion beam provides energy decontamination as neutral particles in the beam, which are undeterred by the effects of the electrodes, continue along the original beam path parallel to the axis 512. The contaminants may then, for example, encounter some type of barrier or absorbing structure (not shown) which halts their forward progress and shields any workpiece from the contaminants. By contrast, the trajectory of the deflected ion beam 526 causes the beam to appropriately encounter and dope select areas of the workpiece (not shown).

It will be appreciated that the arrangement of the electrodes (e.g., the upper and lower mid-gap electrodes 514, 516 intermediate the first and second electrodes 502, 504) also serves to mitigate beam blow up as this configuration minimizes the distance the beam 526 has to travel before encountering the wafer. By having the beam 526 be deflected (e.g., by the upper and lower mid-gap electrodes 514, 516) while concurrently having the beam be focused (e.g., by the first and second electrodes 502, 504), rather than having these bending and focusing stages arranged serially, the end station can be situated closer to the decelerator stage of the ion implantation system.

In the illustrated example(s), particular biases are depicted to facilitate a better understanding of the operation of the deceleration stage 457 of FIG. 4. It will be appreciated, however, that, for purposes of the present disclosure, any suitable biases may be applied among the electrodes to achieve desired results, such as degree of acceleration, deceleration, and/or deflection. Moreover, the particular biases are applied in a selectively variable and controlled manner in order to achieve the selective and variable energy control of the present disclosure. The illustrated bias values in FIG. 9 are, however, effective to demonstrate deceleration of the ion beam 526.

It should be noted that the selective variation of the bias voltage can be further based on one or more predetermined characteristics provided by one of an operator and a characterization of the workpiece 430 of FIG. 4, for example, and can be iterative. For example, a "chain implant" can be performed, wherein a discrete number of implants having variable doses (e.g., a plurality of "chains") are provided to the workpiece 430. Each "chain", for example, can be predetermined through a metrology map of the workpiece 430 prior to implantation. Thus, the overall effect is a variable doping depth profile across the workpiece 430 that is non-uniform, thus defining an energy patterning implant. For example, chains of differing energies may be iteratively performed, wherein the dose and doping depth profile across the workpiece provided in each chain is uniform. Alternatively, topographic feedback can be utilized to selectively vary the bias voltage concurrent with the implantation and/or between chains of implants.

Turning again to FIG. 4, it will be appreciated that different types of end stations 416 may be employed in the implanter 410. For example, a "batch" type end station can simultaneously support multiple workpieces 430 on a rotating support structure, wherein the workpieces 430 are rotated through the path of the ion beam until all the workpieces are completely implanted. A "serial" type end station, on the other hand, supports a single workpiece 430 along the beam path for implantation, wherein multiple workpieces 430 are implanted one at a time in serial fashion, with each workpiece 430 being completely implanted before implantation of the next workpiece 430 begins. In hybrid systems the workpiece 430 may be mechanically translated in a first (Y or slow scan) direction while the beam is scanned in a second (X or fast scan) direction to impart the beam 424 over the entire workpiece 430. By contrast, in a so-called two-dimensional mechanical scan architecture as is known in the art and exemplified by the Optima HD™ Ion Implantation System manufactured and sold by Axcelis Technologies, Inc. of Beverly, Mass., the workpiece 430 may be mechanically translated in front of a fixed position ion beam, in a first (slow) scan direction while the workpiece is simultaneously scanned in a second, substantially orthogonal, (fast) scan direction to impart the beam 424 over the entire workpiece 430.

The end station 416 in the illustrated example is a "serial" type end station that supports a single workpiece 430 along the beam path for implantation. A dosimetry system 452 is included in the end station 416 near the workpiece location for calibration measurements prior to implantation operations. During calibration, the beam 424 passes through dosimetry system 452. The dosimetry system 452 includes one or more profilers 456 that may continuously traverse a profiler path 458, thereby measuring the profile of the scanned beams. The profiler 456 may comprise a current density sensor, such as a Faraday cup, for example, that measures the current density of the scanned beam, where current density is a function of the angle of implantation (e.g., the relative orientation between the beam and the mechanical surface of the workpiece and/or the relative orientation between the beam and the crystalline lattice structure of the workpiece). The current density sensor moves in a generally orthogonal fashion relative to the scanned beam and thus typically traverses the width of the ribbon beam. The dosimetry system, in one example, measures both beam density distribution and angular distribution. Measurement of beam angles can use a moving profiler sensing current behind a mask with slots as described in the literature. The displacement of each individual beamlet from the slot position after a short drift can be used to calculate the beamlet angle. It will be appreciated that this displacement may be referred to as a calibrated reference of beam diagnostics in the system.

The dosimetry system 452 is operably coupled to a control system 454 to receive command signals therefrom and to provide measurement values thereto. For example, the control system 454, which may comprise a computer, microprocessor, etc., may be operable to take measurement values from the dosimetry system 452 and calculate an average angle distribution of the scanned ribbon beam across the workpiece. The control system 454 is likewise operatively coupled to the terminal 412 from which the beam of ions is generated, as well as the mass analyzer 426 of the beamline assembly 414, the scanning element 436 (e.g., via power supply 449), the focusing and steering element 438 (e.g., via power supply 450), the parallelizer 439 and the deceleration/acceleration stage 457. Accordingly, any of these elements can be adjusted by the control system 454 to facilitate desired ion implantation based upon values provided by the dosimetry system 452 or any other ion beam measuring or monitoring device. Control signals can also be generated via look up tables that are stored into memory modules, typically based on empirical data collected through experimentation.

As one example, the ion beam can initially be established according to predetermined beam tuning parameters (e.g., stored/loaded into the control system 454). Then, based upon feedback from the dosimetry system 452, the parallelizer 439 can be adjusted to alter the energy level of the beam can be adapted to adjust junction depths by adjusting the bias applied to electrodes in the ion extraction assembly 423 and the deceleration stage 457, for example. Correspondingly, the strength and orientation of magnetic or electric field(s) generated in the scanner can be adjusted, such as by regulating the bias voltages applied to the scan electrodes, for example. The angle of implantation can be further controlled by adjusting the voltage applied to the steering element 438, or the deceleration/acceleration stage 457, for example.

In accordance with one aspect of the disclosure, control system 454 is provided and configured to establish a predetermined scan pattern on the workpiece 430, wherein the workpiece is exposed to the spot ion beam by means of control of the scanning system 435. The control system 454, for example, is configured to control various properties of the ion beam, such as the beam density and current of the ion beam, as well as other properties associated with the ion beam, specifically energy thereof. Further, the controller 454 is configured to control a speed of scanning of the workpiece 430. Most importantly, in the context of the present disclosure for providing a selectively variable energy ion beam in an ion implantation system, the control system 454 is configured to modify and adjust bias voltages applied to various subsystems in the ion implantation system. With respect to the exemplary ion implantation system 410 described hereinabove, the control system is configured to modify and vary the scan voltage applied to the scanner 435 and further configured to modify and vary, in synchronism with the scan voltage, the bias voltage applied to the deceleration/acceleration stage 457, for correspondingly adjusting the energy and deflection of the ion beam. Such modification of the scan voltage and bias voltage, for example, is continuous (e.g., not discrete), thus providing various advantages over known systems and methodologies.

It will be appreciated that the specific object of the present disclosure, providing selectively controlled variable energy ion implantation of a workpiece, can be implemented in other ion implantation system architectures known in the art. For example, one could obtain selectively controlled variable energy ion implantation results similar to those described hereinabove using a so-called ribbon beam architecture wherein a broad ion beam having a width that spans the diameter of a wafer is delivered to an end station that moves the wafer in a one dimensional scan through the ion beam. One commonly known ion implantation system of this nature is manufactured and sold by Varian Semiconductor Equipment Associates under the trade name VIISta HC. Likewise, one could obtain selectively controlled variable energy ion implantation results similar to those described hereinabove using a so-called two-dimensional mechanical scan architecture wherein a stationary spot ion beam is delivered to an end station that moves the wafer in a two dimensions through the ion beam. One commonly known ion implantation system of this nature is manufactured and sold by Axcelis Technologies, Inc. under the trade name Optima HD.

In order to achieve the desired results of the present disclosure in a ribbon beam or two-dimensional mechanical scan architecture, the system can be modified to incorporate wafer rotation control in a manner similar to the solution described in U.S. Pat. No. 4,929,840 (the entire contents of which are incorporated by reference herein), wherein method and apparatus for controlling the ion dose implanted in a semiconductor wafer is described. In said patent, the wafer or workpiece is positioned on a platen that is rotated in discrete steps, for example by means of a stepper motor. With the scanned along an initial path the dose accumulated by the wafer is measured. When the incremental measured dose equals the total dose to be implanted divided by a predetermined number of steps over which the implant is to be carried out, the motor is stepped one increment. This process is then repeated until the total desired dose is attained.

In a similar manner, the wafer can be transported in a one dimensional or two dimensional scan path through an ion beam having a variable energy as the wafer passes through the stationary ion beam, such as an energy that varies as the wafer passes from top to bottom through the beam path. For example, the beam can be provided at a low energy at the beginning of the wafer scan and gradually (e.g., continuously) increase as the center of the wafer moves toward the stationary beam and an initial dose of ions is accumulated by the wafer. When the incremental measured dose equals the total dose to be implanted divided by a predetermined number of steps over which the implant is to be carried out, the motor is stepped one increment. This process is then repeated until the total desired dose is attained. By maintaining the same variable energy profile for each stepped increment, a variable energy ion implant can be achieved on the wafer.

Thus, in a ribbon beam or two dimensional spot beam, rotating the wafer support in discrete steps, via, for example a stepper motor 470 of FIG. 4, about an axis coinciding with an axis normal to and intersecting the surface of a wafer on the wafer support can be used to selectively vary the energy profile of the ion implantation of the wafer. Such an approach, for example, comprises a control system configured to obtain dose information signals and to transmit signals to provide stepwise rotation of the support means in response to the dose information signals. To satisfy the above needs, the ion implanter, for example, provides the capability for rotating the wafer during or between implants and to provide a system for controlling the rotation of wafers in the above types of ion implantation system architectures.

To meet the above objective, the present disclosure can include a stepper motor 470 to rotate the wafer-receiving platen about the wafer axis and a system for controlling the stepper motor whereby the wafer is rotated in a number of discrete steps (or alternatively, continuously) which can be on the order of 0 to 90 degrees. Thus by making multiple rotations and varying the energy as a function of the slow scan direction of the wafer, the energy can be varied from top edge to center and back to the bottom edge. In one example, it will be understood that the dose will accumulate at 1/n increments where n is the number of discrete rotations. Each step, for example, is controlled in relation to the beam current as measured by a Faraday cup in order to provide a uniform dose distribution as a function of angular rotation. The rotation drive system preferably comprises a stepper motor operable to rotate the platen assembly about an axis normal to the wafer surface and through its center. In operation, the desired total dose and the desired number of revolutions of the platen assembly are input into a stepper motor controller, where the desired dose is divided by the total number of steps of the implant to determine the dose to be implanted per motor step.

As the implant progresses, the accumulated ion dose is collected by a Faraday Cup which provides a beam current signal indicative of the accumulated dose to the controller. When the incremental accumulated dose equals the calculated dose per step a signal is sent to the stepper motor to rotate the wafer one step. The implant proceeds in this manner until the accumulated dose equals the desired total dose, at which time the implant will be complete and the beam is gated "off" by means of a signal to a gate controller.

It will also be understood that the present disclosure can be combined with features known in the art to provide even greater variability of the ion implantation process during ion implantation, For example, as previously indicated, there are disclosures in the prior art directed to the feature of providing variable dose control of implants. The feature of the present disclosure for providing selectively variable energy control of an implant process could be combined with the features for providing selectively variable dose control of an ion implant process to achieve selectively variable energy and dose ion implants across the surface of the wafer.

Figure 10:
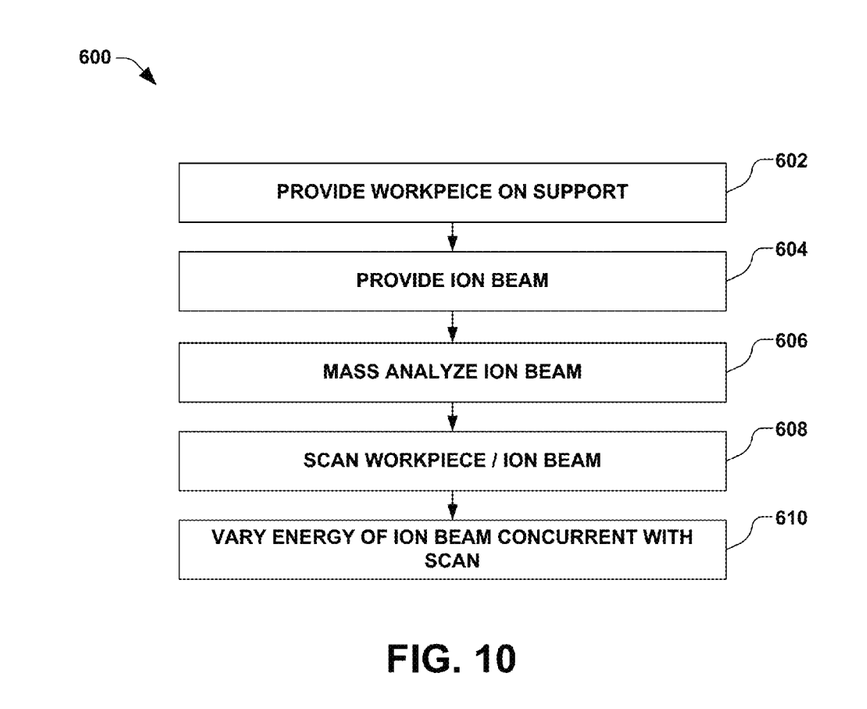
FIG. 10 illustrates a methodology for varying an energy of a spot ion beam in a scanned ion beam implanter, in accordance with yet another aspect.

In accordance with the present disclosure, the system described herein enables a method for implanting ions at varying depths, as illustrated in flowchart form in FIG. 10. It should be noted that while exemplary methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 600 of FIG. 10 begins at act 602 with providing a workpiece on a support. In act 604, an ion beam, such as spot ion beam, is provided, and in act 606, the ion beam is mass analyzed. In act 608, one or more of the workpiece and ion beam is scanned with respect to the other. For example, the workpiece is mechanically scanned in two orthogonal directions in act 608. In another alternative, the ion beam is electrostatically or magnetically scanned in a first direction, and mechanically scanned in a second direction. In yet another alternative, the ion beam is electrostatically scanned in two non-parallel directions.

In act 610, an energy of the ion beam is selectively varied concurrent with the scanning of act 608 in a continuous manner. Accordingly, a resultant depth of implantation of ions into the workpiece is varied along a surface of the workpiece.

Thus, the present disclosure is directed to an ion implantation system and method for varying the energy of the ion beam as it travels across the workpiece or vice versa. The present disclosure is enabled by varying the bias voltages applied to accel/decel electrodes so that the energy of the ions deliver to a workpiece can be selectively varied to achieve a predetermined variable energy pattern at the workpiece. In a preferred embodiment, the present disclosure would provide a continuously variable energy pattern in a response to a continuous function mapped across the workpiece and mapped into matrix, which can be used to program the energy of the beam as a function of location across the workpiece. For example, the present disclosure can be carried out by creating a spatial map in memory, where each cell of that memory location corresponds to a unique energy with respect to an x and y position on the workpiece. It will be understood that the present disclosure could be incorporated in a system for providing variable energy implantation in the form of a continuously variable energy, step function changes in energy or otherwise. Variation in the energy profile across the surface of the workpiece could be symmetrical, and could also be in quadrants or otherwise, such as $X_1$ energy in specified location $Q_1$, $X_2$ energy in $Q_2$, etc.

The exemplary ion implantation system architecture described herein for illustration purposes is particularly well suited for enabling selective variation in ion beam energy across the surface of a workpiece in that the system 410 of FIG. 4 incorporates a scanned spot beam, where in the beam is scanned electronically or magnetically across the surface of the workpiece. This scanning of a spot beam permits modulation of selective variation of the ion beam energy as the beam is scanned. Thus, as the beam is scanned to strike selected positions on the wafer, it goes through all its optical elements of the beamline wherein the beam can be modified to change its energy to a selected energy prior to striking the wafer. Advantageously, changes in the beam energy can be can be accomplished in synchronism with the x and y scanning functions of the scanner and/or end station such that the energy of the scanned beam can be varied as a function of x and y. In addition, the biasing voltages applied to the deceleration/acceleration forced and the deflecting energy filter aspect thereof can be selectivity varied as a function of the x and y position of the scanned beam such that the beam can be constrained to travel on the same path to the wafer, independent of the variation of energy of the ion beam.

It will be understood that all of the selective biasing of components and subsystems can be accomplished via control system 454 and can be implemented via a feedback loop input to the acceleration/deceleration stage, as well as the energy filter, based on the location of the beam output from the scanning system. It will be understood, however, that a feedback loop is not a requirement for enabling the selectively variable energy ion implantation features of the present disclosure, as preprogrammed ion beam energy profiles can also be advantageously implemented to execute the selectively variable energy ion implantation of the present disclosure. As such, ion beam energy can be selectively varied per die, or some other feature or region, either via a feedback loop for the x,y coordinate position of the beam on the wafer, or via some predetermined desired pattern.

The selectively variable energy ion implantation of the present disclosure can also be implemented through a map of the workpiece, wherein the selective variation of the one or more voltages respectively supplied to one or more of the electrodes in the electrode column and/or the energy filter is based on a map of a workpiece positioned on the workpiece support. In another alternative, the ion implantation system of the present disclosure can be provided with a detector, or multiple detectors configured to detect one or more properties of a workpiece positioned on the workpiece support, wherein the selective variation of the one or more voltages respectively supplied to one or more of the electrode column of the deceleration/acceleration stage and/or the energy filter is further based on feedback from the detector. In accordance with this alternative embodiment, the detector or detectors may be preferably configured to detect one or more of a thickness of the workpiece, a thickness of a layer disposed on the workpiece, a die pattern on the workpiece, an edge of the workpiece, a center of the workpiece, or a predefined region on the workpiece, wherein the detected information is provided as input to selectively vary the energy of the ion beam.

Although the invention has been illustrated and described with respect to one or more implementations, it will be understood that alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including any reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system configured to provide a selectively variable energy ion beam to a workpiece, comprising:
   an ion source configured to ionize a dopant material for generating an ion beam;
   a mass analyzer positioned downstream of the ion source, configured to provide a mass resolved ion beam;
   a deceleration/acceleration stage positioned downstream of the mass analyzer configured to receive the mass resolved ion beam to produce the selectively variable energy ion beam;
   an end station positioned downstream of the deceleration/acceleration stage, wherein the end station includes a workpiece support configured to selectively position the workpiece before the selectively variable energy ion beam for ion implantation thereby;
   a scanning apparatus configured to scan one or more of the ion beam and workpiece support with respect to one another;
   one or more power sources operably coupled to one or more of the ion source, mass analyzer, and deceleration/acceleration stages; and
   a controller coupled to said one or more power sources and configured to selectively vary at least a bias voltage supplied to the deceleration/acceleration stage concurrent with the scanning of the ion beam and/or workpiece support, wherein the selective variation of the at least one bias voltage supplied to the deceleration/acceleration stage is based, at least in part, on a position of the ion beam with respect to the workpiece to provide a selectively variable energy ion beam thereto.

2. The ion implantation system of claim 1, further comprising:
   an energy filter for deflecting ions having a desired energy to define an ion beam having a desired energy to be deliver to the end station;
   wherein said controller is further configured to selectively vary one or more voltages respectively supplied to the energy filter concurrent with the scanning of the ion beam and/or workpiece support such that the selective variation of the one or more voltages is based, at least in part, on the energy of the ion beam.

3. The ion implantation system of claim 1, wherein the selective variation of the at least one bias voltages selectively varies an energy of the ion beam directed toward the workpiece positioned on the workpiece support in synchronism with the scanning of the ion beam and/or workpiece support.

4. The ion implantation system of claim 3, wherein the selective variation of the at least one bias voltage is based on a location of the ion beam along a scan path.

5. The ion implantation system of claim 3, wherein the selective variation of the at least one bias voltage is further based on one or more predetermined characteristics provided by one of an operator and a characterization of the workpiece.

6. The ion implantation system of claim 1, wherein the scanning apparatus comprises an electrostatic and/or magnetic scanner configured to respectively electrostatically and/or magnetically scan the ion beam along at least a first scan axis.

7. The ion implantation system of claim 6, wherein the scanning apparatus further comprises a mechanical scanning system configured to mechanically scan the workpiece support along a second scan axis that is non-parallel to the first scan axis.

8. The ion implantation system of claim 7, wherein the first scan axis is orthogonal to the second scan axis.

9. The ion implantation system of claim 1, wherein the scanning apparatus comprises a mechanical scanning system configured to mechanically scan the workpiece support along a both first scan axis and a second scan axis that is substantially orthogonal to the first scan axis.

10. The ion implantation system of claim 1, wherein the selective variation of the one or more voltages respectively supplied to the deceleration/acceleration stage is based on feedback from the scanning system indicating the position of the ion beam with respect to the workpiece.

11. The ion implantation system of claim 2, wherein the selective variation of the one or more voltages respectively supplied to the energy filter is based on feedback from the scanning system indicating the position of the ion beam with respect to the workpiece.

12. The ion implantation system of claim 1, wherein the selective variation of the at least one bias voltages respectively supplied to the deceleration/acceleration stage is predetermined.

13. The ion implantation system of claim 2, wherein the selective variation of the one or more voltages respectively supplied to the energy filter is predetermined.

14. The ion implantation system of claim 1, wherein the selective variation of the one or more voltages respectively supplied to one or more of the electrode column and the energy filter is based on a map of a workpiece positioned on the workpiece support.

15. The ion implantation system of claim 14, wherein the map of the workpiece comprises a map of a material layer thickness across a surface of the workpiece.

16. The ion implantation system of claim 1, wherein the selective variation of the one or more voltages supplied to the deceleration/acceleration stage and the energy filter is further based, at least in part, on a location of one or more features associated with a workpiece positioned on the workpiece support.

17. The ion implantation system of claim 15, wherein the one or more features comprise one or more of a layer formed on the workpiece, a die pattern on the workpiece, an edge of the workpiece, a center of the workpiece, and a predefined region on the workpiece.

18. The ion implantation system of claim 1, wherein the electrode column comprises one or more of an ion beam accelerator and an ion beam decelerator.

19. The ion implantation system of claim 1, further comprising a detector configured to detect one or more properties of a workpiece positioned on the workpiece support, and wherein the selective variation of the one or more voltages respectively supplied to one or more of the electrode column and the energy filter is further based on feedback from the detector.

20. The ion implantation system of claim 19, wherein the detector is configured to detect one or more of a thickness of the workpiece, a thickness of a layer disposed on the workpiece, a die pattern on the workpiece, an edge of the workpiece, a center of the workpiece, and a predefined region on the workpiece.

21. The ion implantation system of claim 1, wherein the workpiece support includes:

a motor configured to rotate said support in discrete steps about an axis coinciding with an axis normal to and intersecting the surface of the workpiece received on the workpiece support, wherein the controller is configured to control the motor; and a dose measuring for measuring a dose of ions implanted in the workpiece, wherein the controller is operable to receive dose information signals from the dose measuring device and to transmit control signals to the motor for further providing stepwise rotation of the workpiece support.

22. The ion implantation system of claim 21, wherein said motor comprises a stepper motor.

23. The ion implantation system of claim 1, wherein the selective variation of the at least one bias voltage supplied to the deceleration/acceleration stage is iterative, thus defining a chain implant, and is further based, at least in part, on one or more predetermined characteristics provided by one of an operator and a characterization of the workpiece.

24. The ion implantation system of claim 1, wherein the selective variation of the at least one bias voltage supplied to the deceleration/acceleration stage is generally continuous.

* * * * *